United States Patent [19]

Tatsuno et al.

[11] Patent Number: 4,791,650
[45] Date of Patent: Dec. 13, 1988

[54] PHASED-ARRAY SEMICONDUCTOR LASER APPARATUS

[75] Inventors: Kimio Tatsuno, Fuchu; Yoshito Tsunoda, Mitaka, both of Japan

[73] Assignee: Hitachi, Ltd., Tokyo, Japan

[21] Appl. No.: 922,673

[22] Filed: Oct. 24, 1986

[30] Foreign Application Priority Data

Oct. 25, 1985 [JP] Japan .................................. 60-237280
Dec. 23, 1985 [JP] Japan .................................. 60-287729

[51] Int. Cl.⁴ ............................................. H01S 3/19
[52] U.S. Cl. ...................................... 372/50; 372/46; 372/99; 372/101; 350/401
[58] Field of Search .................... 372/98, 99, 100, 101, 372/45, 46, 50; 350/401, 402, 403

[56] References Cited

U.S. PATENT DOCUMENTS

| Re. 31,806 | 1/1985 | Scifres et al. | 372/50 |
| 4,547,396 | 10/1985 | Botez et al. | 372/45 |
| 4,594,719 | 6/1986 | Ackley | 372/45 |
| 4,656,641 | 4/1987 | Scifres et al. | 372/99 |

FOREIGN PATENT DOCUMENTS 0100242 8/1984 European Pat. Off. .
0132361 11/1978 Japan .................................. 350/401

Primary Examiner—William L. Sikes
Assistant Examiner—Georgia Y. Epps
Attorney, Agent, or Firm—Antonelli, Terry & Wands

[57] ABSTRACT

A phased-array semiconductor laser having a plurality of light emitting regions aligned in a line and providing correlation of the oscillation phases between adjacent light emitting regions, and including a beam controlling system for providing the phased-array semiconductor laser having a far-field pattern of a single-lobe.

8 Claims, 4 Drawing Sheets

PHASED-ARRAY SEMICONDUCTOR LASER APPARATUS

BACKGROUND OF THE INVENTION

This invention relates to phased-array semiconductor lasers produced by aligning a plurality of semiconductor lasers adjacent to one another and capable of obtaining a high output laser having a uniform phase as a whole.

Conventional phased-array semiconductor lasers have now attained a stage where the correlation of phases can be established between adjacent semiconductor lasers, and an output of about 500 mW can be obtained as described for example in prior art reference "Phased Array Diode Lasers" in the "Laser Focus", June, 1984. However, the far-field pattern is apt to become a double-lobe, and even if the beam having such a double-lobe intensity distribution is converged by an optical system of a laser printer or an optical disc, for example, an optical spot of a diffraction limit cannot be obtained and the ratio of optical utilization is at most about 50%.

SUMMARY OF THE INVENTION

It is therefore an object of the present invention to provide a phased-array semiconductor laser apparatus which can obtain a far-field pattern of a single-lobe type even in the phased-array semiconductor lasers described above, and can also obtain an optical spot of diffraction limit on a recording medium.

In a phased-array semiconductor laser of the type which includes a plurality of light emission regions aligned in a line and which provides a correlation of oscillation phases between the adjacent light emission regions, the present invention resides in a phased-array semiconductor laser apparatus including means for providing a far-field pattern having a single lobe.

In accordance with one embodiment of the present invention, the means to provide the single lobe pattern consists of a half-wave plate disposed at part of an optical path of the laser light from the phased-array laser and a polarization beam splitter for combining the laser light from the half-wave plate with the rest of the laser light from the phased-array laser, so that the far field pattern of the phased array laser has a single lobe intensity.

In accordance with another embodiment of the present invention, the means to provide the single lobe consists of thin films for providing a phase shift of $\lambda/2$ ($\lambda$: laser wavelength) which are disposed for every other light emission end plane of the phased-array semiconductor laser, so that the phases of the laser light emitted from the phased-array semiconductor laser are aligned and a far-field pattern of a single-lobe can be obtained.

BRIEF DESCRIPTION OF THE DRAWINGS

FIG. 1b is a waveform diagram showing the oscillation mode of the semiconductor laser of FIG. 1a;

DESCRIPTION OF THE PREFERRED EMBODIMENTS

Figure 1A:
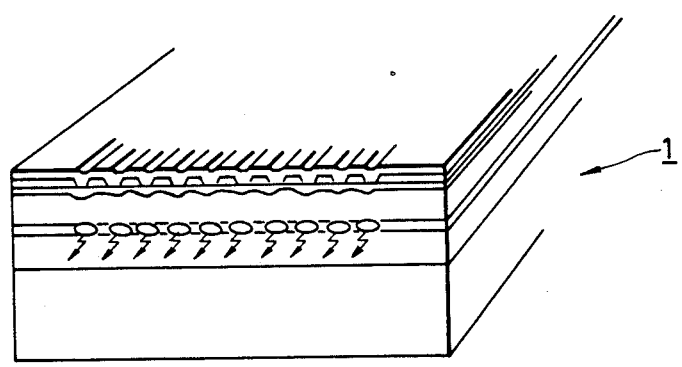
FIG. 1a is a conceptual view of a phased-array semiconductor laser used in the present invention.
Figure 1B:
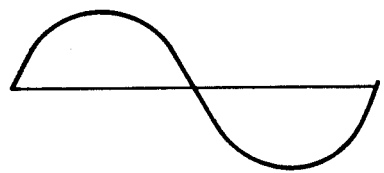
Figure 1C:
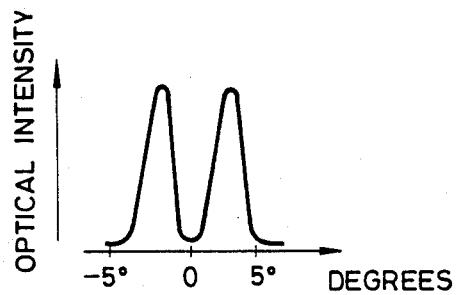
FIG. 1c is a waveform diagram showing a far-field pattern of the phased-array semiconductor laser.

In the phased array semiconductor laser used in the present invention, a plurality of light emission regions are aligned monolithically and their phases are coupled by shortening distances between adjacent light emission regions so that oscillation is effected while the oscillation phases of all of them are mutually coherent. In the phased array semiconductor laser of this kind, ten types of oscillation modes exist if the light emission regions are ten, for example, as shown in FIG. 1a. Among these modes, a 180° out-of-phase mode in which the phases of the adjacent light emission regions are deviated from each other by $\pi$ as shown in FIG. 1b is most likely to rise. Such a mode is a double-lobe mode having two peaks in a far-field as shown in FIG. 1c.

Figure 2:
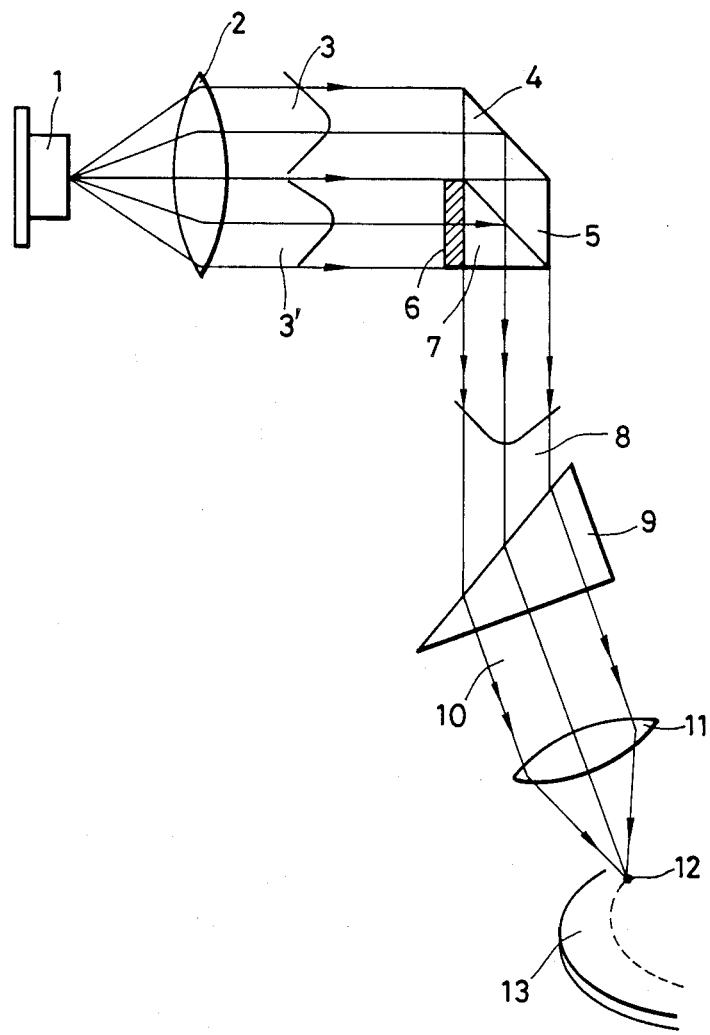
FIG. 2 shows a first embodiment of the present invention and is a schematic structural view when the embodiment is applied to an optical system of an optical disc device.

FIG. 2 is a schematic structural view of one embodiment of the present invention which is applied to the optical system of an optical disc device. In the drawing, reference numeral 1 represents the phased-array semiconductor laser shown in FIG. 1. The beam emitted from this phased-array semiconductor laser 1 is received, converged and collimated by a coupling lens 2. As described already, the far-field pattern of the beam from the phased-array semiconductor laser 1 is divided into two lobes 3 and 3'. Among them, one beam 3 of the two is reflected by a total reflecting mirror 4 and reaches a polarization beam splitter 5. At this time, the plane of polarization of each of the beams 3 and 3' is in parallel with the plane of the sheet of paper on which the drawing is presented or in other words, it is P polarized light with respect to the reflecting mirror 4 and the polarization beam splitter 5. Therefore, the beam 3 passes through the polarization beam splitter 5. On the other hand, the beam 3' passes through a half-wave plate 6, becomes an S polarized beam 7, is reflected by the polarization beam splitter 5, comes to share the optical axis with the transmission beam 3 and thus becomes one synthesized beam having a single lobe. In this manner, a single-lobe far-field pattern can be obtained. In this embodiment, the reflecting mirror 4, the half-wave plate 6 and the polarization beam splitter 5 are kept in close contact, and integrated, with one another.

A triangular prism 9 is disposed in order to shape the beam from the polarization beam splitter 5, which is elliptic, into a round beam. Though only one prism 9 is shown disposed in the drawing, two or more prisms may be used in combination. The synthetic beam 10 thus obtained is led to an objective lens 11 and is spotted onto a recording medium 13 such as an optical disc, a photosensitive drum for a laser printer, a liquid crystal, or the like, in order to make image formation.

Figure 3:
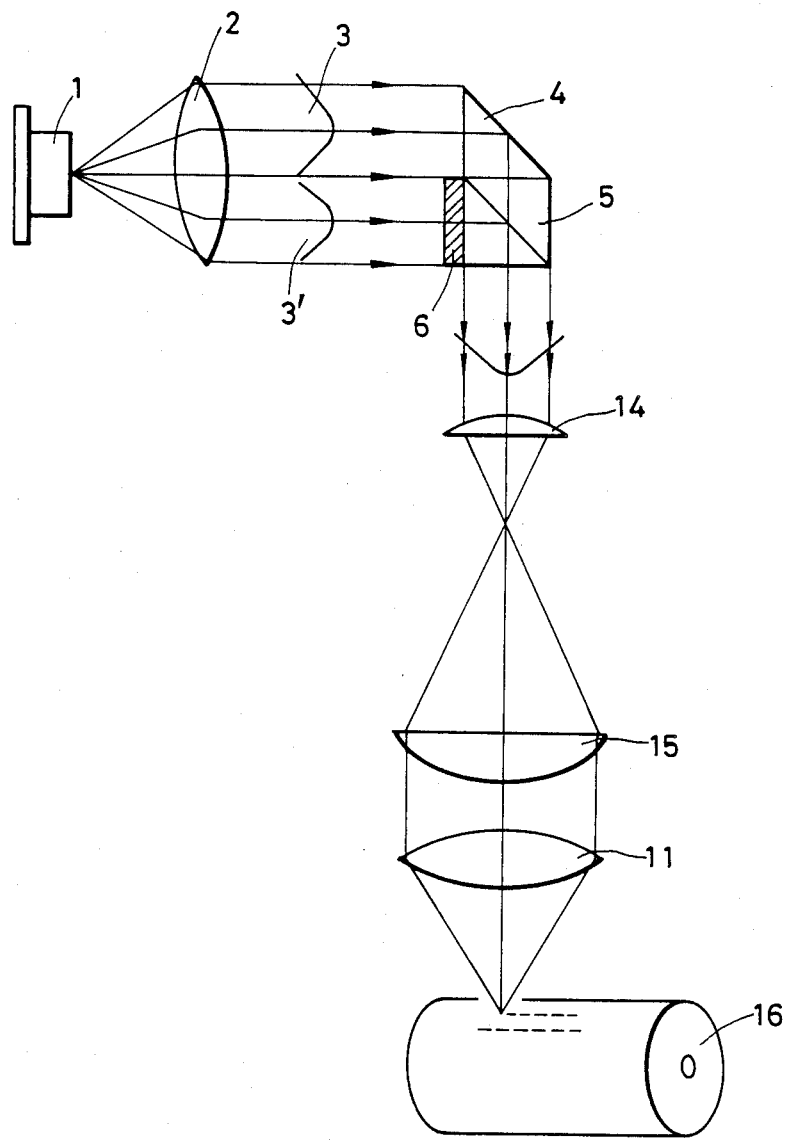
FIG. 3 shows a modified embodiment of the first embodiment, and is a schematic structural view when the embodiment is applied to an optical system of a laser beam printer.

FIG. 3 shows a modified embodiment of the embodiment shown in FIG. 2, which is applied to an otpical system of a laser beam printer. The synthesizing method of the beams is exactly the same as that of the embodiment shown in FIG. 2, but a difference of this embodiment from the first embodiment lies in that a set of cylinder lenses 14 and 15 are used to shape the elliptic beam. The ratio of the focal distances of the cylinder lenses 14 and 15 is set to r when the ratio of the major and minor axes of the elliptic beam is r. It must be hereby noted that in gain guide type phased-array semiconductor lasers in general, bending of phases occurs simultaneously in addition to phase deviation. This is referred to as "astigmatism". In accordance with this embodiment, this astigmatism can also be corrected, by deviating the relative positions of the two cylinder lenses by a distance which offsets the astigmatic difference of the light source.

In accordance with this embodiment, the phased-array semiconductor lasers oscillating in the mode in which the phases are deviated by 180° are synthesized in the far-field to obtain the single beam, which is led to the converging lens. Accordingly, it is possible to obtain the spot having the diffraction limit which is determined by the wavelength of the semiconductor lasers and the numerical aperture of the converging lens. Furthermore, after the beams 3 and 3' having the phases that are deviated by 180° are synthesized, their planes of polarization become perpendicular so that they are synthesized as a scalar sum of intensity without causing mutual interference and a high output beam can be obtained at a high efficiency.

Figure 4A:
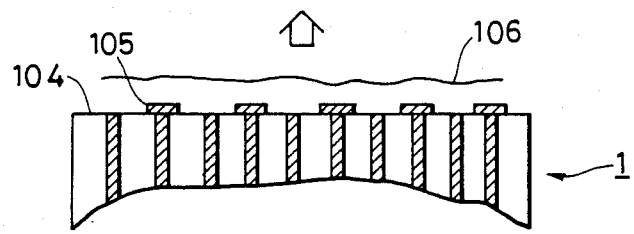
FIG. 4a is a sectional view showing the phased-array semiconductor laser in accordance with the present invention.
Figure 4B:
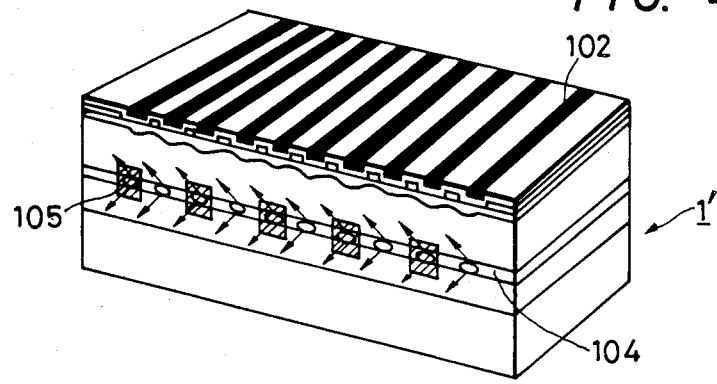
FIG. 4b is a perspective view of the phased-array semiconductor array in accordance with the present invention.

FIG. 4 shows a phased-array semiconductor laser in accordance with another embodiment of the present invention. In this embodiment, thin films providing a phase shift of $\lambda/2$ are disposed on one of the end planes of the adjacent light emission regions in order to deviate the phase by $\pi$ so that the phase of the beams immediately after emission become flat. In other words, thin film 105 causing a phase shift of $\lambda/2$ ($\lambda$: wavelength) are disposed on the end surface 104 of the phased-array semiconductor laser for every other light emission regions in order to make flat the phase 106 of the wave plane of the emitted beam as shown in FIGS. 4a and 4b.

The thin film can be easily deposited by sputtering $SiO_2$, for example. Besides $SiO_2$, amorphous Si, $MgF_2$, $ZrO_2$, $CeF_3$ and the like can be used as the material of the thin film 105. The thickness of the thin film is selected so that the optical path, that is, an optical thickness obtained by multiplying the refractive index by the thickness, is equal to $\lambda/2$.

Figure 4C:
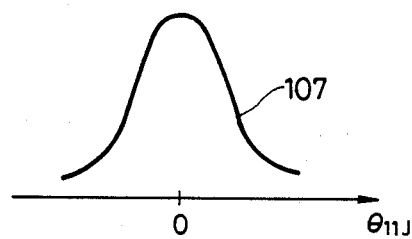
FIG. 4c is a waveform diagram showing the far-field pattern of the semiconductor laser shown in FIG. 4b.

When the phase is made flat by the method described above, the far-field pattern of the emitted beam no longer has a double-lobe but has a single-lobe as shown in FIG. 4c.

Figure 5:
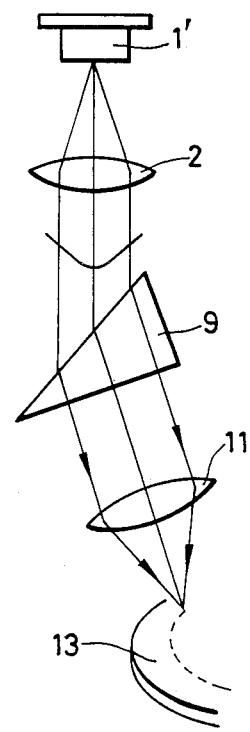
FIG. 5 is a schematic structural view when the phased-array semiconductor laser shown in FIG. 4 is applied to an optical system of an optical disc device.

FIG. 5 is a schematic structural view when the phased-array semiconductor laser 1' shown in FIG. 4 is applied to the optical system of an optical disc device. In the drawing, reference numeral 1' represents the phased-array semiconductor laser shown in FIG. 4, and the far-field pattern of the beam obtained from this laser 1' is the single-lobe as described above. The laser beam is collimated by the coupling lens 2, passes through the beam shaping prism 9 and is subjected to image formation as a spot on the recording medium 13 by the converging lens 11. The reflected light from the recording medium 13 is separated and extracted from the beam from the laser by the beam splitter (not shown in the drawing) disposed between the prism 9 and the converging lens 11, is received by an optical detector and is used for detecting spot control signals such as an information signal, a focusing signal, a tracking signal, and the like.

As described above, the present invention can obtain the single-lobe beam from the phased-array semiconductor laser having a plurality of light emission regions. When the single-lobe beam is applied to the optical system of a laser beam printer or an optical disc, a beam having an extremely high output can be obtained at a high efficiency. The printing speed can be improved in the case of the laser printer and the bit transfer rate of signals can be further improved in the case of the optical disc.

The present invention can be applied to the optical system of an image scanner or a liquid crystal display in addition to the optical system of an optical disc recorder.

What is claimed is:

1. A phased-array semiconductor laser apparatus comprising:
   a phased-array semiconductor laser having a plurality of light emitting regions aligned on a single substrate such that the modes of oscillation of each of the plurality of light emitting regions are phase-locked to one another so as to provide an output laser beam which has a far-field pattern of two lobes; and
   an optical system for converging the output laser beam from said phased-array semiconductor laser onto a recording medium, said optical system including a half-wave plate disposed in the optical path of a first part of the output laser beam forming a first one of the two lobes and a polarization beam splitter for combining the first part of the output laser beam from said half-wave plate with a second part of the laser beam which forms a second one of the two lobes so that a combined laser beam having a far-field pattern of a single lobe is provided for being converged onto the recording medium.

2. A phased-array semiconductor laser apparatus according to claim 1, further comprising a reflecting mirror for reflecting the second part of the output laser beam to said polarization beam splitter, said reflecting mirror being integral with said half-wave plate and said polarized beam splitter.

3. A phased-array semiconductor laser apparatus according to claim 1, wherein said optical system further includes first lens means for condensing the output laser beam from said phased-array semiconductor laser, beam shaping means for shaping the laser beam transmitted through said first lens means, and second lens means for converging the laser beam shaped by said beam shaping means onto the recording medium.

4. A phased-array semiconductor laser apparatus according to claim 1, wherein said optical system further includes first lens means for condensing the output laser beam from said phased-array semiconductor laser, beam shaping means for shaping the laser beam transmitting through said first lens means, and second lens means for converging the laser beam shaped by said beam shaping means onto the recording medium, said half-wave plate and said polarization beam splitter being disposed in an optical path between said first lens means and said shaping means.

5. A phased-array semiconductor laser according to claim 2, wherein said thin film is formed by sputtering $SiO_2$.

6. A phased-array semiconductor laser apparatus comprising:

a phased-array semiconductor laser having a plurality of light emitting regions aligned on a single substrate such that the modes of oscillation of each of the plurality of light emitting regions are phase-locked to one another so as to provide an output laser beam which has a far-field pattern of two lobes;

at least one thin film having an optical thickness of $\lambda/2$ (where $\lambda$ is a wave length of the light emitted by each light-emitting region) being disposed on the single substrate and covering every other one of said plurality of light emitting regions such that said phased-array semiconductor laser provides an output laser beam with a far-field pattern of a single-lobe; and an optical system for converging the output laser beam from said phased-array semiconductor laser onto a recording medium.

7. A phased-array semiconductor laser apparatus comprising:

a phased-array semiconductor laser having a plurality of light emitting regions aligned on a single substrate such that the modes of oscillation of each of the plurality of light emitting regions are phase-locked to one another so as to provide an output laser beam which has a far-field pattern of two lobes;

first lens means for condensing the output laser beam from said phased-array semiconductor laser;

a half-wave plate for providing a phase shift of one-half (½) wavelength to a first part of the laser beam forming one of the two lobes condensed by said first lens means;

a polarization beam splitter for combining the first part of the laser beam transmitted through said half-wave plate and a second part of the laser beam forming another of the two lobes condensed by said first lens means so as to provide a combined laser beam having a far-field pattern of a single-lobe;

beam shaping means for shaping the combined beam from said polarization beam splitter; and second lens means for converging the combined laser beam shaped by said beam shaping means onto a recording medium.

8. A phased-array semiconductor laser apparatus comprising:

a phased-array semiconductor laser having a plurality of light emitting regions aligned on a single substrate such that the modes of oscillation of each of the plurality of light emitting regions are phase-locked to one another so as to provide an output laser beam which has a far-field pattern of two lobes;

at least one thin film having an optical thickness of $\lambda/2$ (where $\lambda$ is a wave length of the light emitted by each light-emitting region) being disposed on the single substrate and covering every other one of the plurality of light emitting regions such that said phased-array semiconductor laser provides an output laser beam with a far-field pattern of a single-lobe;

first lens means for condensing the output laser beam from said phased-array semiconductor laser; and beam shaping means for shaping the laser beam condensed by said first lens means; and second lens means for converging the laser beam shaped by said beam shaping means onto a recording medium.

* * * * *